United States Patent
Anthony et al.

[11] Patent Number: 6,040,230
[45] Date of Patent: Mar. 21, 2000

[54] METHOD OF FORMING A NANO-RUGGED SILICON-CONTAINING LAYER

[75] Inventors: John Mark Anthony, McKinney; Robert M. Wallace, Dallas, both of Tex.; Yi Wei, Chandler, Ark.; Glen Wilk, Dallas, Tex.

[73] Assignee: Texas Instruments Incorporated, Dallas, Tex.

[21] Appl. No.: 09/039,075

[22] Filed: Mar. 13, 1998

Related U.S. Application Data

[60] Provisional application No. 60/045,196, Apr. 30, 1997.

[51] Int. Cl.[7] .................................................. H01L 21/20
[52] U.S. Cl. ............................................ 438/398; 438/255
[58] Field of Search .................................... 438/253, 255, 438/396, 398, 481

[56] References Cited

U.S. PATENT DOCUMENTS

| | | | |
|---|---|---|---|
| 4,549,926 | 10/1985 | Corboy, Jr. et al. | 438/412 |
| 5,234,857 | 8/1993 | Kim et al. | 438/389 |
| 5,612,558 | 3/1997 | Harshfield | 257/298 |

*Primary Examiner*—Tuan H. Nguyen
*Attorney, Agent, or Firm*—Mark A. Valetti; Carlton H. Hoel; Frederick J. Telecky, Jr.

[57] ABSTRACT

An embodiment of the instant invention is a method of forming a nano-rugged silicon-containing layer, the method comprising the steps of: providing a first silicon-containing layer (steps 202 or 802); providing a patterning layer over the first silicon-containing layer (steps 204 or 804); the patterning layer comprised of an amorphous substance; providing a second silicon-containing layer (steps 206 or 808) over the patterning layer; and wherein the patterning layer creates a nano-rugged texture in the second silicon-containing layer. Preferably, the first and second silicon-containing layers are comprised of polycrystalline silicon. In an alternative embodiment, the patterning layer is comprised of a material which has small holes such that the step of providing the second silicon-containing layer utilizes the first silicon-containing layer as a seed layer through the small holes so as to form the second silicon-containing layer. In another alternative embodiment, the second silicon-containing layer is comprised of a plurality of islands of the silicon-containing material separated by voids in the material. Preferably, the patterning layer is comprised of $SiO_2$.

8 Claims, 10 Drawing Sheets

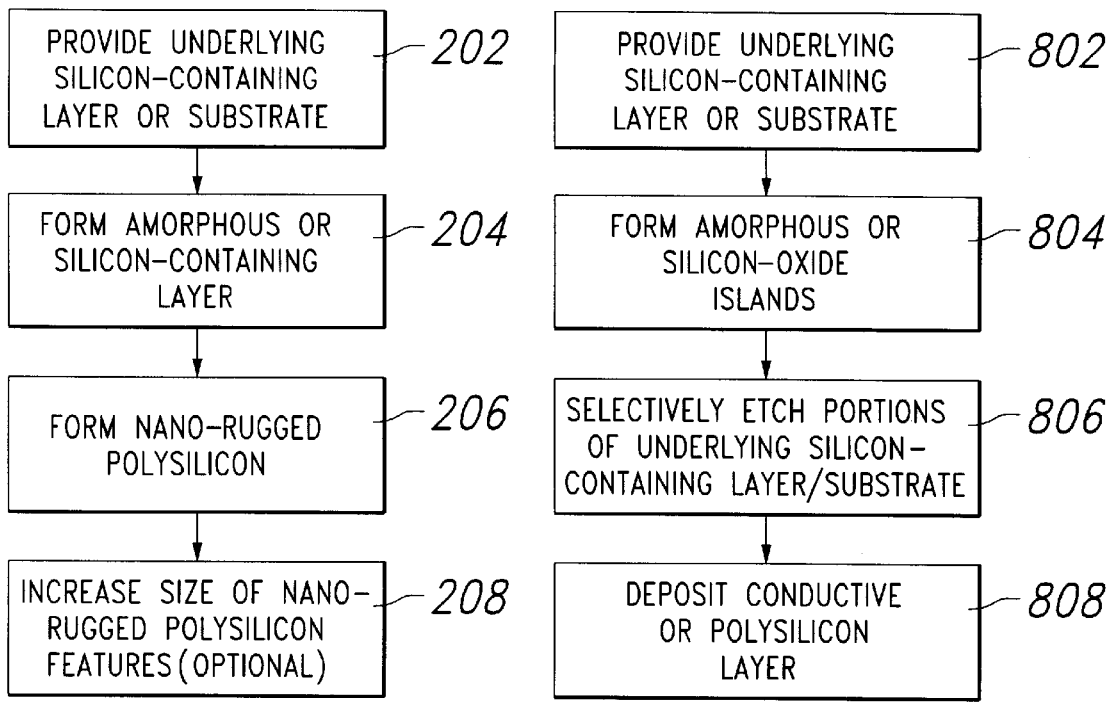
Fig. 2
Fig. 7
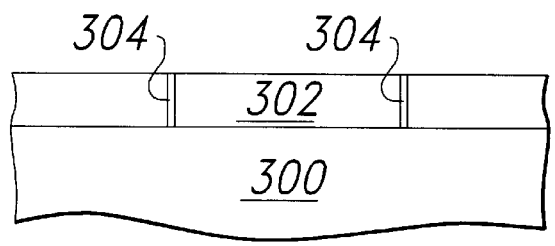
Fig. 3a
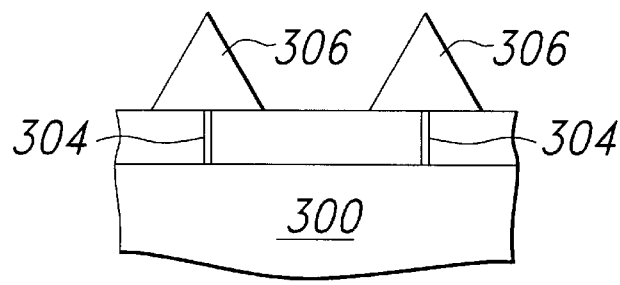
Fig. 3b

METHOD OF FORMING A NANO-RUGGED SILICON-CONTAINING LAYER

CROSS-REFERENCE TO RELATED PATENT/PATENT APPLICATIONS

This is a Non Provisional application filed under 35 USC 119(e) and claims priority of prior provisional, Ser. No. 60/045,196 of inventor Anthony, et al., filed Apr. 30, 1997.

The following commonly assigned patent/patent applications are hereby incorporated herein by reference:

| U.S. Pat. No. /Ser No. | Filing Date | TI Case No. |
| --- | --- | --- |
| U.S. Pat. No. 5,830,532 | 3/18/1996 | TI-22384 |
| application Ser. No. 08/819,058 | 3/18/1997, ABN | TI-22978 |

FIELD OF THE INVENTION

The instant invention pertains to semiconductor device fabrication and processing and more specifically to a method of fabricating a rugged silicon-containing layer.

BACKGROUND OF THE INVENTION

Presently, most dynamic random access memory (DRAM) manufacturers form a capacitor above a silicon substrate so as to form the storage capacitor. The number of capacitors that can be fit on a single chip determines the number of bits that can be stored within the device. As the need for more memory increases, the need arises to shrink all of the devices which makes up the memory circuitry. Hence, it is desirable to reduce the physical size of the capacitor.

Despite the need to shrink the physical size of each memory cell, the actual capacitance of each memory cell must not significantly decrease. A significant decrease in the capacitance of the memory cell will cause the soft error rate to increase. The soft error rate is a measure of the rate of errors (misread or miswritten data) which are not the direct result of damage to the DRAM. One cause for the increase in soft error rate relates to the large difference in capacitance between the bitlines and the storage cells. Typically, the bitlines have a much higher capacitance than each memory cell. Therefore, using simple voltage division, small changes in the capacitance of the bitlines will cause errors when data is read from or stored to a storage cell, especially when the voltage level stored in the cell has degraded due to losses in the storage cell. Hence, it is preferable to increase the capacitance of each memory cell so that the soft error rate is decreased.

Many DRAM manufacturers have manipulated the structure and composition of the memory cells so as to increase the capacitance of the memory cells as well as to shrink their physical size. In an effort to increase the capacitance of the storage cell, some manufacturers have tried "stacked capacitors" or "crown cell" cell capacitors. Each of these attempt to increase the capacitance per unit area by extending the capacitor in the vertical direction instead of the lateral direction. An example of a "crown cell" is given in provisionally filed patent applications Ser. No. 60/036,998 (TI-21973) and Ser. No. 60/037,247 (TI-21537), both are incorporated herein by reference.

Another approach to increase the capacitance of the storage cell while using less lateral area involves the use of "rugged polysilicon" to form the bottom electrode of the storage cell. More specifically, the bottom electrode is formed of a polysilicon layer which has features that extend between 70 and 100 nm. For examples of this type of rugged polysilicon ("rugged poly") see U.S. Pat. Nos. 5,385,863, 5,561,311, 5,554,557 and 5,445,999.

SUMMARY OF THE INVENTION

An embodiment of the instant invention is a method of forming a nano-rugged silicon-containing layer, the method comprising the steps of: providing a first silicon-containing layer; providing a patterning layer over the first silicon-containing layer; the patterning layer comprised of an amorphous substance; providing a second silicon-containing layer over the patterning layer; and wherein the patterning layer creates a nano-rugged texture in the second silicon-containing layer. Preferably, the first and second silicon-containing layers are comprised of polycrystalline silicon. In an alternative embodiment, the patterning layer is comprised of a material which has small holes such that the step of providing the second silicon-containing layer utilizes the first silicon-containing layer as a seed layer through the small holes so as to form the second silicon-containing layer. In another alternative embodiment, the second silicon-containing layer is comprised of a plurality of islands of the silicon-containing material separated by voids in the material. Preferably, the patterning layer is comprised of $SiO_2$.

Another embodiment of the instant invention is a method of forming a nano-rugged silicon-containing layer, the method comprising the steps of: providing a first silicon-containing layer; providing a patterning structure over the first silicon-containing layer; the patterning structure comprised of $SiO_2$; forming a second silicon-containing layer over the patterning structure; and wherein the patterning structure creates a nano-rugged texture in the second silicon-containing; layer. Preferably, the first and/or second silicon-containing layers are comprised of polycrystalline silicon. In an alternative embodiment, the step of forming the second silicon-containing layer is comprised of growing polycrystalline silicon structures from the first silicon-containing layer through holes in the pattering structure. In another alternative embodiment, the step of forming the second silicon-containing layer is comprised of forming $SiO_2$ islands separated by voids in the $SiO_2$ between the islands in the step of providing the patterning structure and then depositing a polycrystalline silicon structure over the island and voids of $SiO_2$.

Another embodiment of the instant invention is a method of fabricating an electrical device over a silicon-containing substrate, the method comprising the steps of: providing a first silicon-containing layer; providing a patterning layer over the first silicon-containing layer; the patterning layer comprised of an amorphous substance; providing a second silicon-containing layer over the patterning layer; and wherein the patterning layer creates a nano-rugged texture in the second silicon-containing layer. Preferably, the electrical device is a storage capacitor, which is used in a memory device.

BRIEF DESCRIPTION OF THE DRAWINGS

FIGS. 1a–1j are cross-sectional views illustrating a process flow for forming a DRAM which utilizes the instant invention.

FIG. 2 is a flow chart illustrating the method of one embodiment of the instant invention.

FIGS. 3a–3b are cross-sectional views illustrating the processing of a device using the method of the instant invention illustrated in FIG. 2.

FIGS. 5a–5c illustrate that a rugged nanocrystalline silicon containing layer can be formed using the method of the instant invention as illustrated in FIG. 2.

FIGS. 6a–6c illustrate that rugged nanocrystalline silicon-containing layer can be formed using the method of the instant invention as illustrated in FIG. 2.

FIG. 7 is a flow chart illustrating the method of another embodiment of the instant invention.

DETAILED DESCRIPTION OF THE DRAWINGS

Basically, the instant invention involves the novel formation of a nano-rugged conducting (or semiconducting) layer. Preferably, the layer would be comprised of doped or undoped polysilicon. In the context of the instant invention, "nano-rugged" means feature sizes (height is measured from the valley of the grain/feature to the top of the grain/feature and width is measured at the base of the grain) which are much less than those of the typical rugged poly (typically 70 to 100 nm). More specifically, the height of the grains of the nano-rugged film formed using the methods of the instant invention are preferably on the order of one to six nanometers and the width is preferably on the order of one to four nanometers. Preferably, the nano-rugged layer formed using the embodiments of the instant invention is used to form the bottom electrode of the storage cell for a memory device. However, other devices can be formed using the instant invention.

An exemplary method of forming a DRAM device will now be described with respect to FIGS. 1a–1j. This method is included to illustrate how the present invention could be easily incorporated in a DRAM process flow.

Figure 1A:
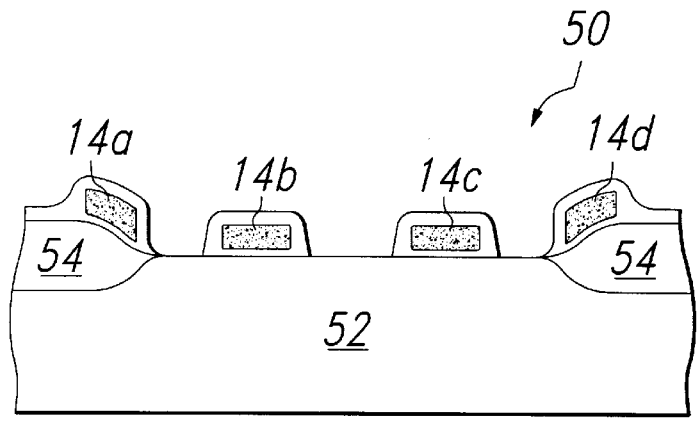

Referring now to FIG. 1a, a DRAM device 50 will be formed in a semiconductor substrate 52. FIG. 1a illustrates field isolation regions 54 and four word line/pass gates 14. While illustrated with field isolation 54, it is also noted that other isolation techniques such as trench isolation can be used. Pass transistors 14b and 14c will form the gates of the two memory cells which will be illustrated in these drawings. Word lines 14a and 14d, on the other hand, will serve as the pass transistors for gates in other rows of the device.

Figure 1B:
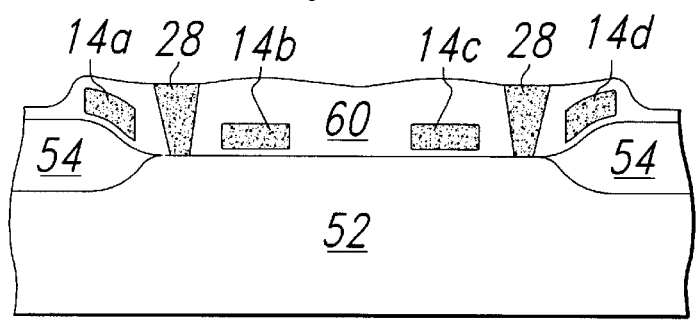

Referring now to FIG. 1b storage plate plugs 28 are formed. Regions 28 can be formed, for example, by depositing a layer of oxide material over the word lines 14 and then etching contact holes through the oxide of 60. A self-aligned contact etch can be performed by first surrounding each word line 14 with a nitride (not shown) and etching the overlying oxide 60. Plugs 28 can be formed from polysilicon or a metal.

Figure 1C:
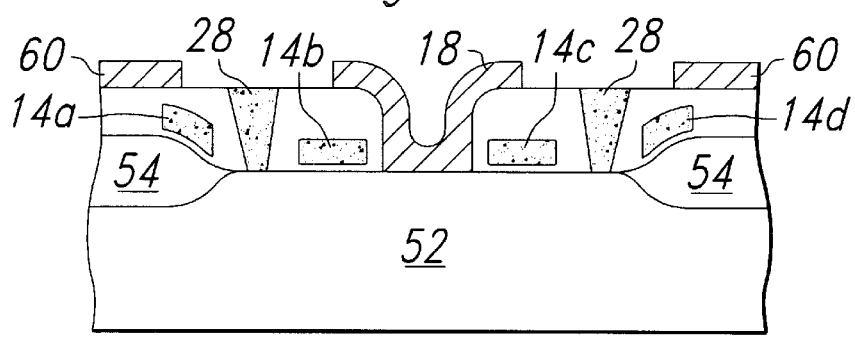

Bit line regions 18 are formed in FIG. 1c. As illustrated, in this example, the two memory cells being fabricated will share a single bit line. While it is not critical to this invention, the bit line may comprise any conductive material such as metal silicide, silicon or a metal.

Figure 1D:
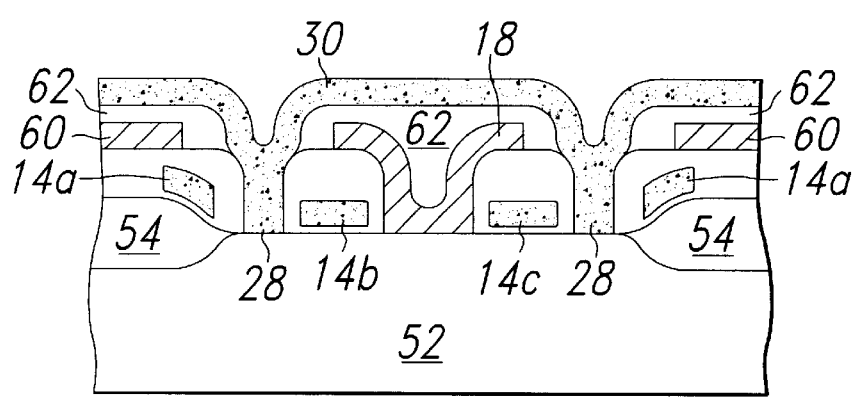

Referring now to FIG. 1d, formation of the storage node of the capacitors is continued. An insulating layer 62 is formed over the bit lines 18. Using standard patterning and etching techniques, a contact hole is formed through insulating layer 62 to expose plug 28. Subsequently a second conductive layer 30 is formed over the insulating layer and so as to contact plugs 28. The conductive layer 30 preferably comprises a metal or metal nitride.

Figure 1E:
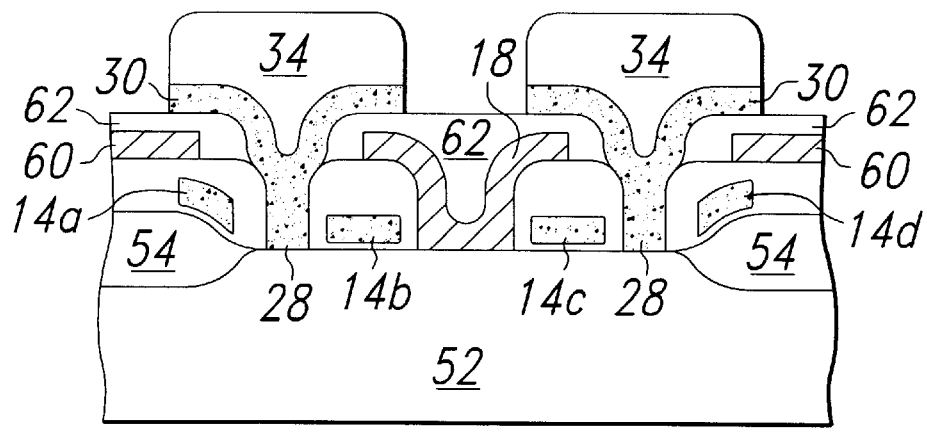

Referring now to FIG. 1e dummy masking layer 34 is formed over the conductive layer 30. Using standard patterning and etching techniques, masking layer 34 is patterned so as to protect the portion of layer 30 which will become part of the storage node 22. Masking layer 34 and conductive layer 30 are then etched to create the portion of the storage node 22 structure illustrated in FIG. 1e.

Figure 1F:
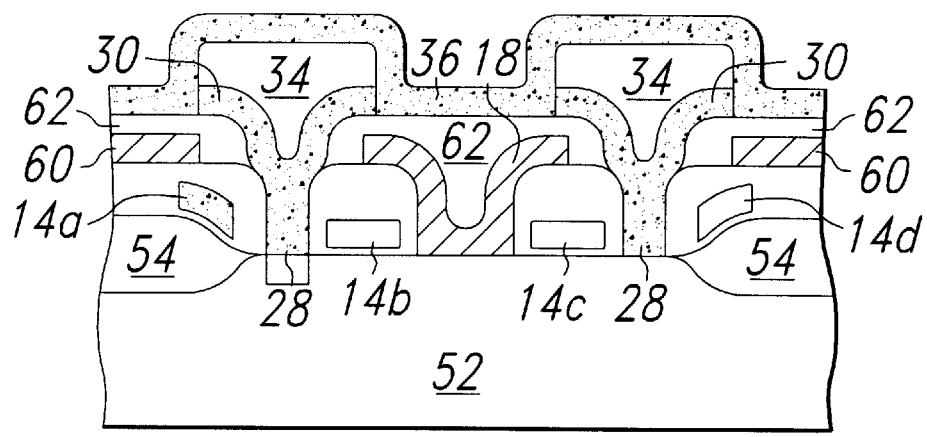
Figure 1G:
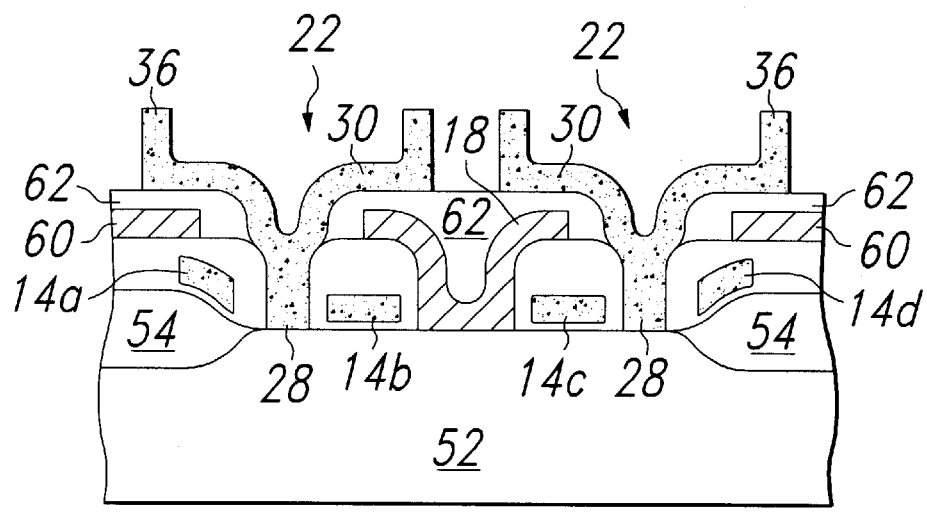

Referring now to FIG. 1f, a second conductive layer 36 is formed over the structure. Conductive layer 36 surrounds dummy layer 34. The layer 36 can then be anisotropically etched so as to leave side walls along the dummy layers 34. After the dummy layer 34 is removed, a cylindrical storage node 22 will remain as illustrated in FIG. 1g. The nitridation process described earlier can now be performed.

Using the prior art processing techniques, a standard ONO dielectric could then be formed over the storage node 22 to serve as capacitor dielectric. In the preferred embodiment, however, a high dielectric constant material such as tantalum pentoxide, BST, or PZT will be used. If tantalum pentoxide is used, though, an underlying nitride or oxynitride passivation layer is preferable so as to reduce the formation of silicon oxide. The formation of a dielectric layer and second conductive layer can be performed using standard processing.

It is noted that a number of additional steps will be required before the DRAM device is completed. Since these steps are not critical to the present invention, they will not be described here beyond the acknowledgment of their existence.

Referring to FIGS. 2 and 3a–3b, one embodiment of the instant invention is to form a nano-rugged polysilicon layer ("nano-rugged poly") using a layer between a silicon-containing layer (or substrate) and the nano-rugged poly. The layer between the silicon-containing layer and the nano-rugged poly can an amorphous layer which is conductive (not specifically illustrated in any of the figures) or an amorphous layer with small pin holes (the number of pinholes needs to be sufficient enough to allow nucleation of polysilicon grains but few enough such that the grains size is not too large). FIGS. 3a and 3b, relate to the portion of this embodiment that involves using the pin holes in this interlevel layer.

In step 202 of this process, a silicon-containing layer or substrate 300 is provided. Preferably, region 300 is either a silicon (100) substrate, an epitaxial silicon layer situated on a silicon substrate, or a polysilicon layer. In the DRAM device of FIGS. 1a–1g, region 300 would be equivalent to regions 30 and 36 of FIG. 1g. In step 204, layer 302 is formed on region 300. Preferably, layer 302 is comprised of silicon and oxide (more preferably $SiO_2$) or another amorphous material (preferably a conductive amorphous material such as TiN, iridium oxide, or ruthenium oxide). If layer 302 is comprised of a conductive amorphous material then pin holes 304 are not needed in layer 302. In other words, layer 302 preferably is amorphous and does not have the same lattice configuration as underlying layer 300. In the case where layer 302 is comprised of $SiO_2$, layer 302 may have small openings (or pin holes) 304 such that underlying layer 300 can act as a seed layer such that polysilicon structures 306 can form from layer 300 through openings 304. Preferably, layer 302 and pin holes 304 (if layer 304 is not comprised of an amorphous conductive material) are formed by annealing a clean silicon-containing underlayer (layer 300) with a thin oxide (preferably around 1–3 nm trick) formed thereon in a high vacuum chamber in the presence of oxygen (partial pressure of oxygen is around $10^{-8}$ to $10^{-10}$ Torr, preferably) at an elevated temperature (preferably around 700 to 750 C) for a controlled time (preferably around 30 to 120 seconds). If layer 302 is comprised of an amorphous conducting material (such as TiN or $IrO_2$, or $RuO_2$), layer 302 is preferably formed either by deposition of the compounds or deposition of the metal component followed by nitridation (TiN) or oxidation ($IrO_2$ or $RuO_2$ of the metals. Layer 302 is preferably on the order of one to three nanometers thick.

In step 206, nano-rugged polysilicon structures 306 are formed. Preferably, this is accomplished by depositing silicon from a gas source (as is done in most chemical vapor deposition processes) or from a solid source (as is done in molecular beam epitaxy processes). This may be achieved at substrate temperatures of around 400 to 900 C under pressures ranging from $10^{-10}$ to $10^{-7}$ Torr. After step 206, the height of poly structures 306 is on the order of 2 to 3 nm.

If step 208 is performed, nano-rugged poly structures 306 can be increased in diameter. Preferably, this is accomplished by annealing the surface at around 600 C under vacuum or in an inert ambient. Step 208 can enlarge poly structures 306 from a diameter of around 10 nm to a diameter of around 20 to 30 nm.

Figure 4:
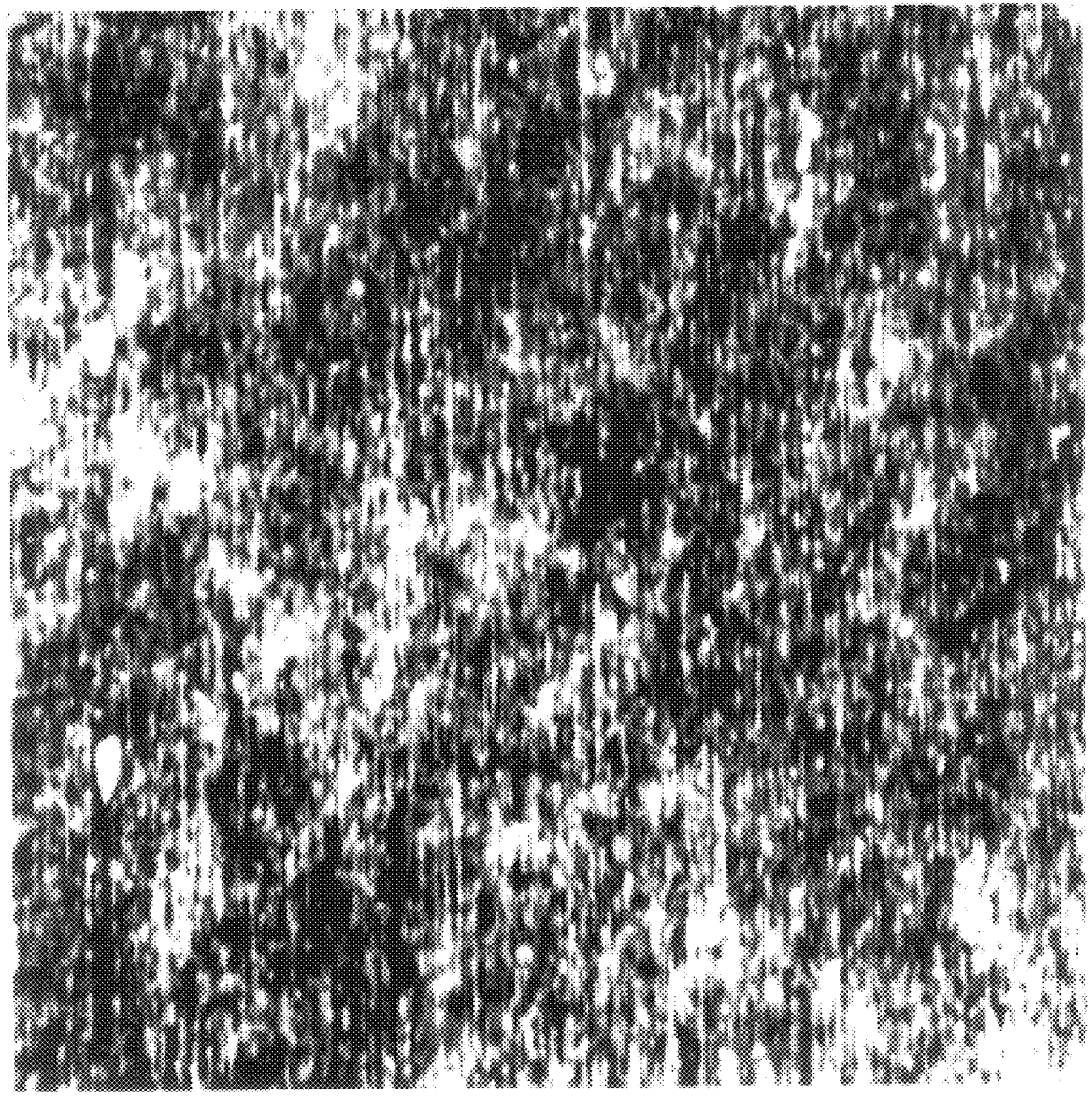
FIG. 4 is a 200×200 nm scanning tunneling microscope (STM) image of a Si(100) surface covered with an ultrathin amorphous oxide.

FIG. 4 is a 200 nm by 200 nm STM image of a Si(100) surface covered with an ultrathin amorphous oxide. This ultrathin oxide film can be used as layer 302 in the instant invention. While, any continuous (free of pin holes) amorphous conductive film or an amorphous insulating film with pin holes would be sufficient to form layer 302 of the instant invention, the type of thin oxide depicted in FIG. 4 is preferable.

Figure 5A:
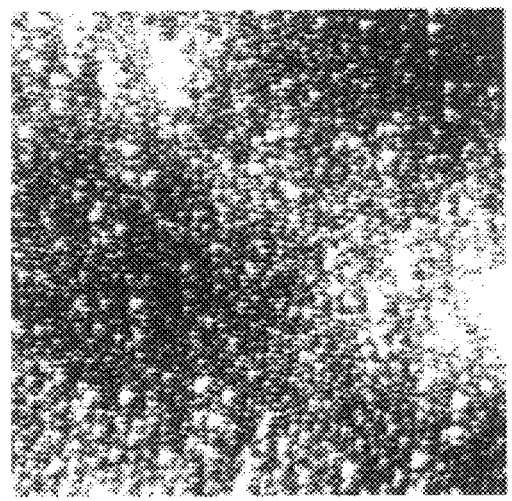
FIG. 5a is a 500×500 nm STM image.
Figure 5B:
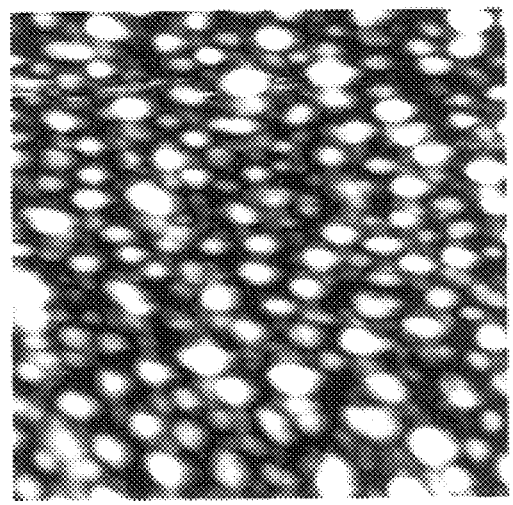
FIG. 5b is a 100×100 nm STM image.
Figure 5C:
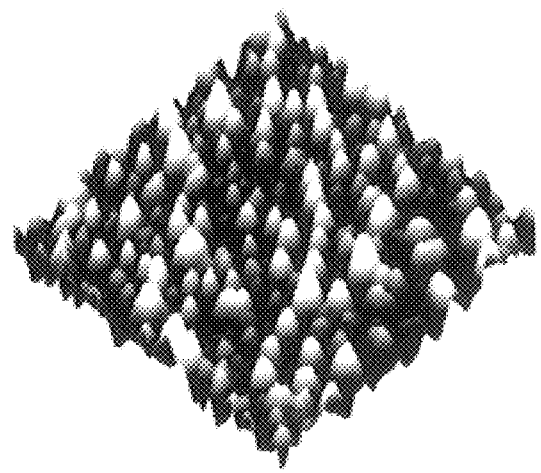
FIG. 5c is a perspective view.

FIGS. 5a–5c illustrate how the nano-rugged poly of the instant invention can be formed using the ultrathin oxide on the silicon underlying layer of FIG. 4. In FIG. 5, silicon was deposited on the ultrathin oxide layer of FIG. 4 at an elevated temperature (preferably around 600 C). As can be seen in the figures, the originally deposited silicon layer was about 4 nm thick and the size of the nano crystals (which forms the nano-rugged poly) is on the order of 10 nm in diameter and 3 nm in height.

Figure 6A:
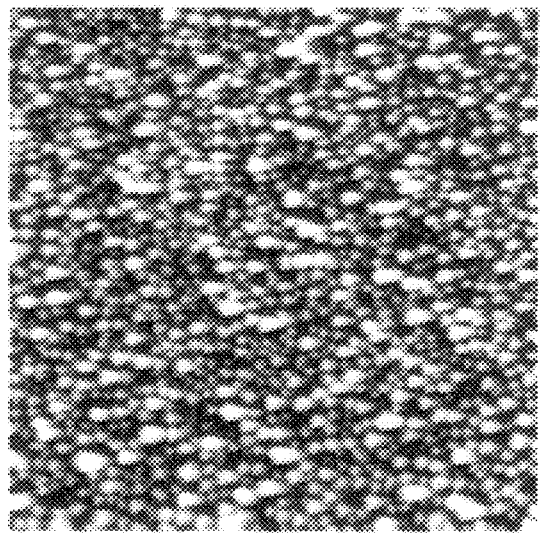
FIG. 6a is a 500×500 nm STM image.
Figure 6B:
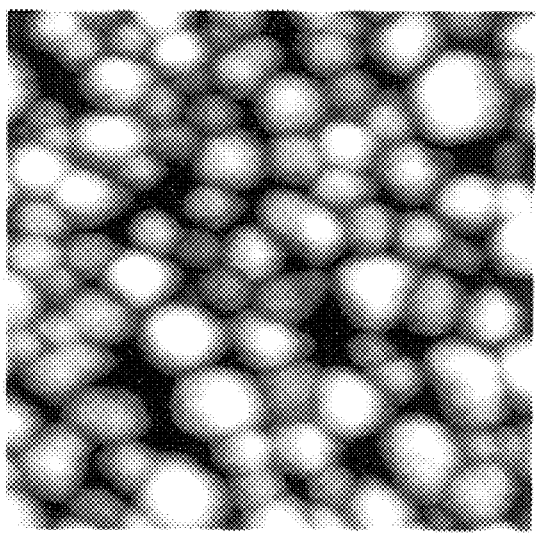
FIG. 6b is a 100×100 nm STM image.
Figure 6C:
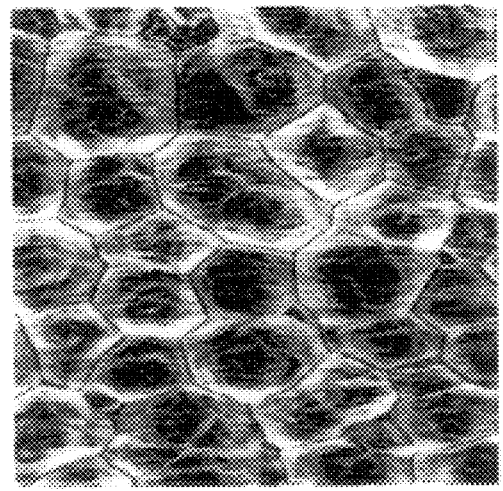
FIG. 6c is a 50×50 nm STM image.
Figure 8A:
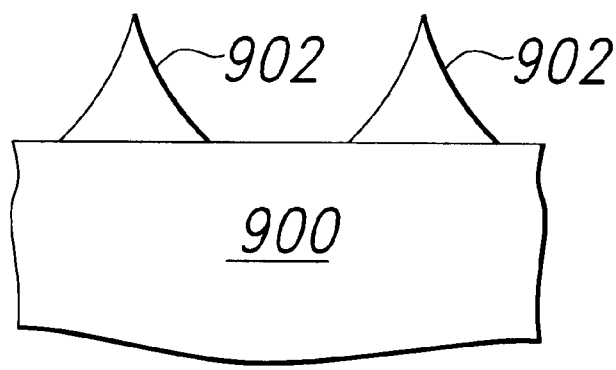
FIGS. 8a–8c are sectional views illustrating the processing of a device using the method of the instant invention illustrated in FIG. 7.
Figure 8B:
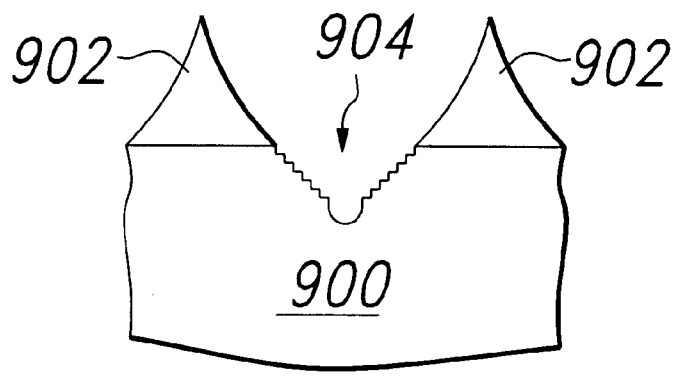
Figure 8C:
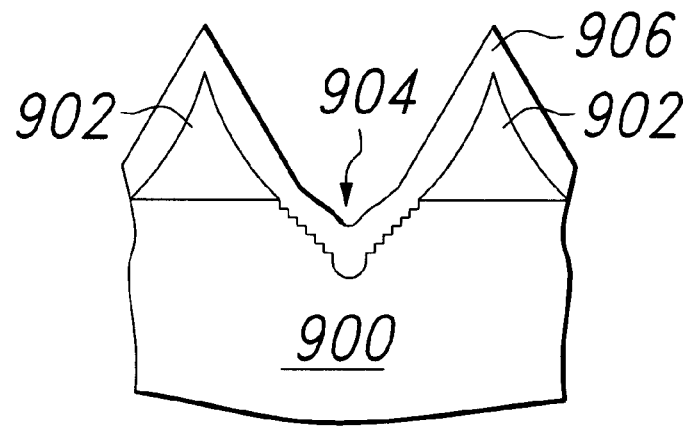

Referring to FIGS. 6a–6c, the size of these nano crystals can be easily controlled using this embodiment of the instant invention by varying the temperature applied to the substrate. The films of FIGS. 6a–6c were grown at a higher surface temperature (approximately 630 C) than those of FIGS. 5a–5c. The nanocrystals grow in size to form a polycrystalline grain structure due to the enhanced diffusivity of silicon atoms at this temperature. An edge-delineated STM image of this granular structure is provided in FIG. 6c, where the boundaries between the nanocrystals are visible. The angles between these boundaries are approximately 60 to 120 degrees, which reflects the symmetry of the (111) facets of the silicon.

Figure 9:
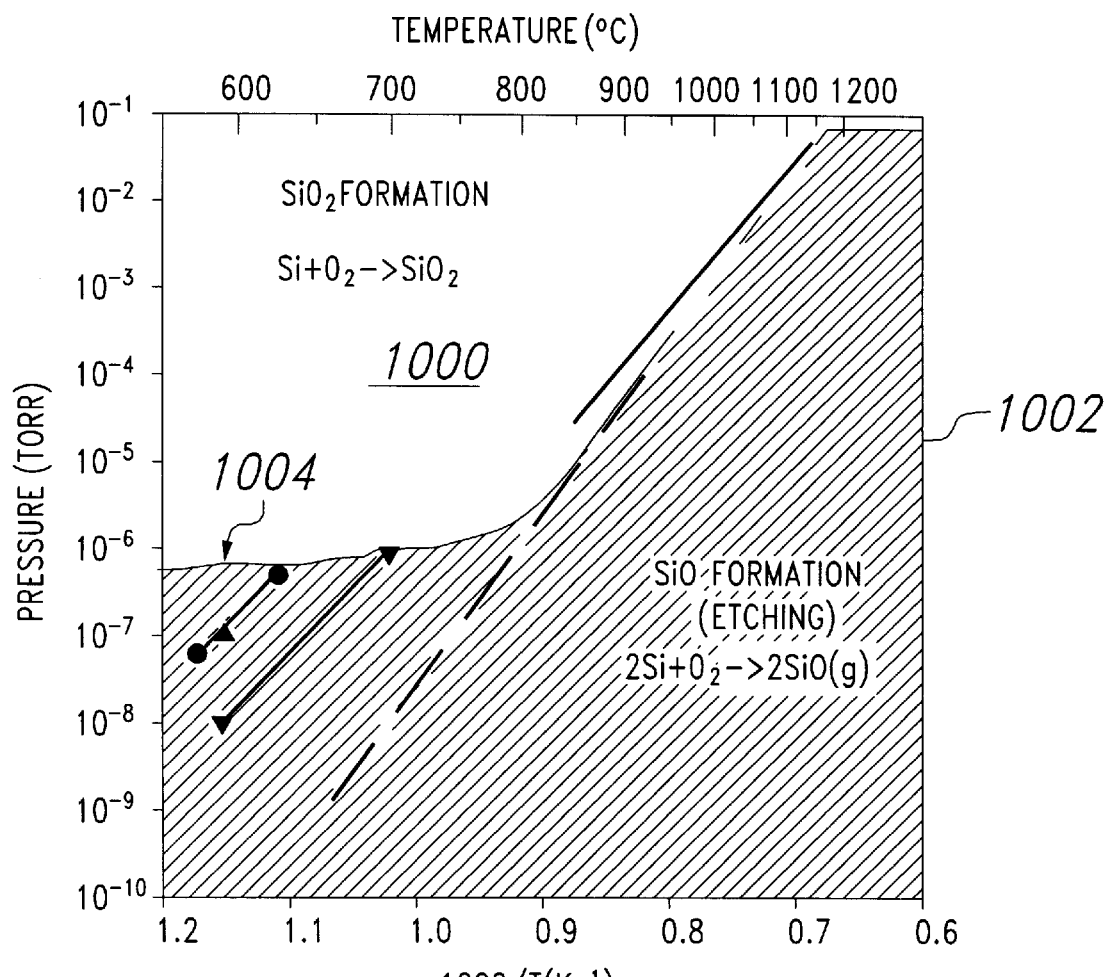
FIG. 9 is a graph illustrating pressure-temperature phase space the processing of a device using the method of the instant invention illustrated in FIG. 7.

In order to enhance the surface area of features 306 even further (assuming that features 306 are comprised of silicon and oxygen—silicon dioxide), oxygen etching can be used so to roughen the surface. When oxygen interacts with a silicon surface, two possible reactions occur, depending on the combination of oxygen pressure and the silicon surface temperature in the pressure-temperature phase space (see FIG. 9). If there is a high oxygen pressure and low temperature (region 1000), the oxygen molecules react with the silicon to form $SiO_2$: $Si+O_2\rightarrow SiO_2$. If the pressure of the oxygen is low and there is a high temperature (region 1002), the oxygen molecules react with the silicon to form volatile Si). In this case, the oxygen molecules etch silicon. A critical curve 1004 separates regions 1000 and 1002. As the oxygen pressure and the substrate temperature are controlled so as to be around the critical curve 1004, there will be silicon dioxide nucleation and silicon etching, simultaneously.

Another embodiment of the instant invention is illustrated in FIGS. 7 and 8a–8c. In step 802 of this process, a silicon-containing layer or substrate 900 is provided. Region 900 preferably has steps (preferably on the order of 0.1 to 0.3 nm high). In other words, the top surface of region 900 is preferably clean and vicinal (see FIG. 10). Preferably, region 900 is either a silicon (100) substrate, an epitaxial silicon layer situated on a silicon substrate, or a polysilicon layer. In the DRAM device of FIGS. 1a–1g, region 900 would be equivalent to regions 30 and 36 of FIG. 1g. In step 804, islands 902 are formed on region 900. Preferably, islands 902 are comprised of silicon and oxide (more preferably $SiO_2$) or an amorphous material (more preferably a conductive amorphous material such as TiN, iridium oxide, or ruthenium oxide). Preferably, layer 902 is formed by exposing layer 900 to an $1\times10^{-7}$ Torr oxygen-containing ambient (preferably $O_2$) at around 500 to 650 C (more preferably around 600 C) for around 10 to 20 minutes (more preferably around 15 minutes). Islands 902 are preferably on the order of 3 nm high.

In step 806, portions of regions of layer 900 situated under areas where there are no islands 902 are removed (preferably by chemically etching) away so as to form removed features 904 (essentially silicon oxide islands with exposed portions of the removed underlying layer between these islands). Step 806 is preferably performed using $O_2$ as an etchant (thereby yielding SiO); having an ambient pressure of $1\times10^{-8}$ to $1\times10^{-5}$ Torr and an ambient temperature of 550 to 900 C; and for approximately 5 to 15 minutes. In one embodiment, a conductive layer 906 may be formed on features 902 and 900 so as to form the roughened surface for the bottom electrode for a DRAM storage cell (step 808). Preferably, layer 906 would be comprised of polysilicon (preferably doped) but it could be comprised of any conductive material.

In an alternative embodiment, the etching process may be continued such features 902 are etched. Therefore, features 902 can be removed and the result is a roughened region 900.

Figure 10:
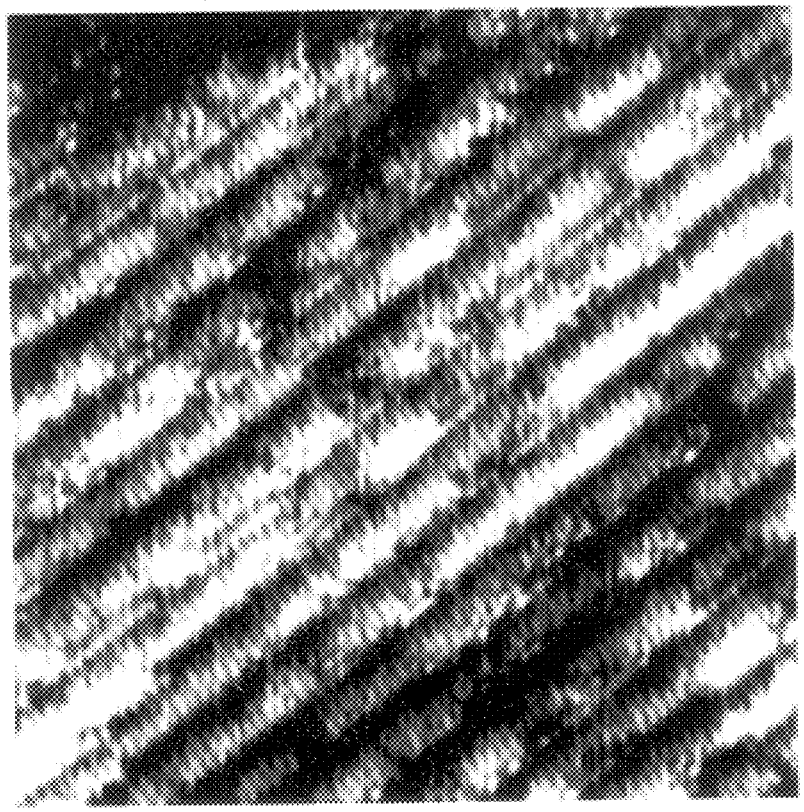
FIG. 10 is an image showing the miscut underlying silicon-containing layer which is need for the method of FIG. 7.
Figure 11:
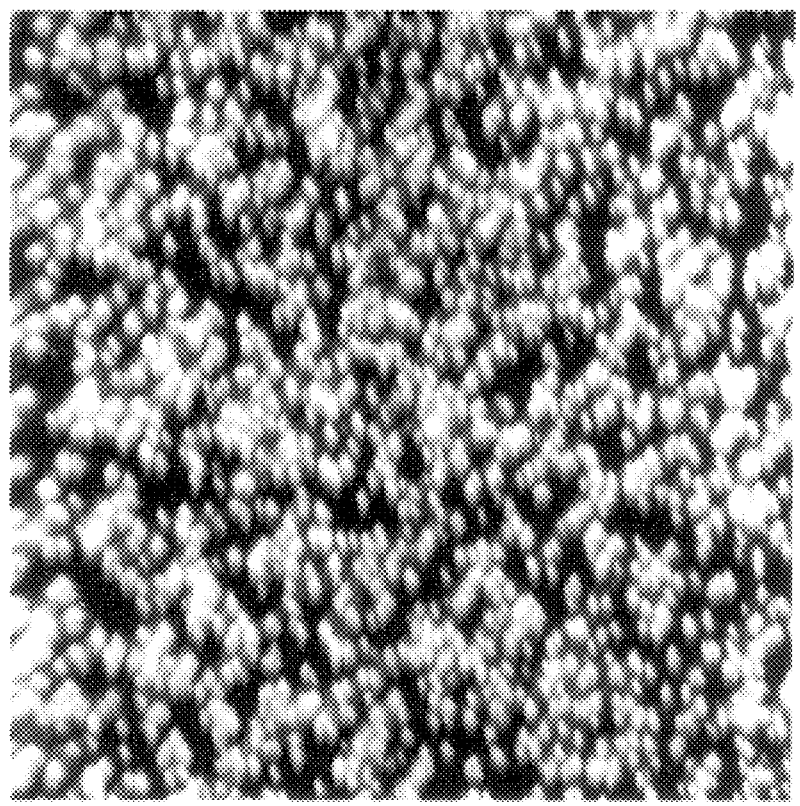
FIG. 11 is an image showing the islands formed the processing of a device using the method of the instant invention illustrated in FIG. 7.
Figure 12:
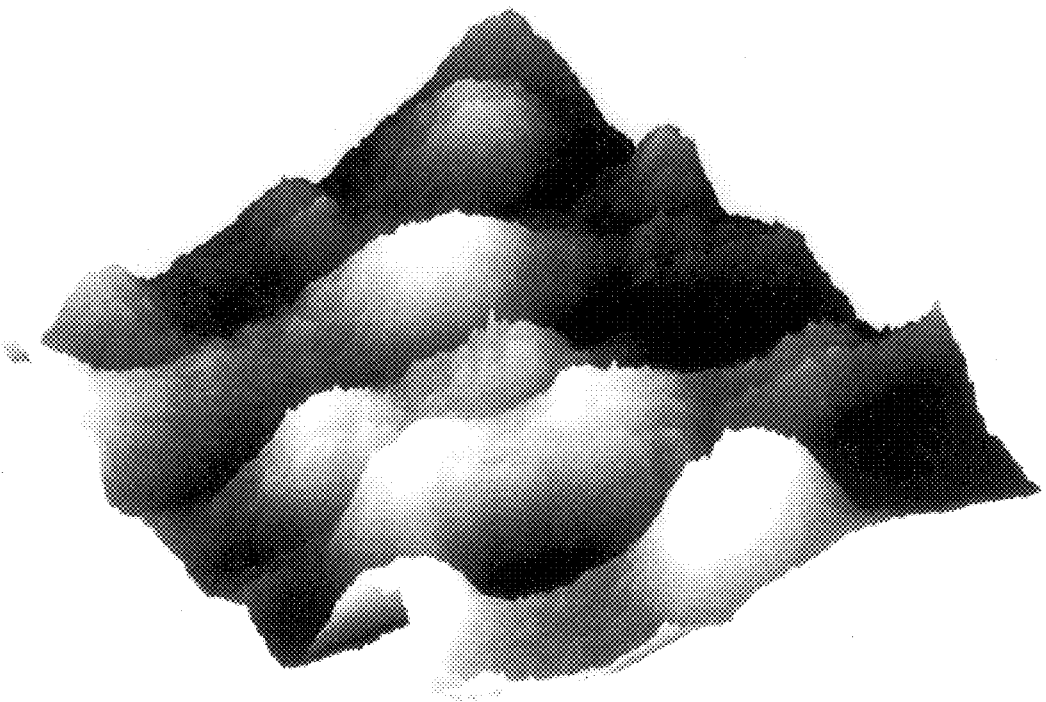
FIG. 12 is a perspective view illustrating the nano-rugged features formed the processing of a device using the method of the instant invention illustrated in FIG. 7.

An example of this embodiment of the instant invention starts with a clean silicon (100) surface, four degrees off toward [011] direction, as is shown in FIG. 10. Double atomic height (around 0.28 nm) steps and dimer rows perpendicular to the step edges can be seen in FIG. 10. This surface is atomically flat. After the surface is exposed to around 1×10$^{-7}$ Torr O$_2$ at 600 C substrate temperature for around 15 minutes, many SiO$_2$ islands nucleate on the surface as is shown in FIG. 11. Since oxide islands protect the silicon underneath them and the oxygen continues to etch the silicon areas between the oxide islands (features 904), the surface is no longer flat and no steps can be seen, which can be seen in FIG. 12. If oxide islands 904 are removed, then a clean silicon surface with many silicon protrusions is realized.

Any of the above embodiments can be implemented on any silicon, epitaxial silicon, polysilicon, or rugged polysilicon layer. In fact, since the features formed using the embodiments of the instant invention tend to be much smaller than those formed using standard rugged poly methods, the features of the instant invention can be formed on a rugged poly layer formed using standard processing so as to provide further surface enhancement of the rugged poly layer.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of forming a nano-rugged silicon-containing layer, said method comprising the steps of:

providing a first silicon-containing layer;

providing a patterning layer over said first silicon-containing layer; said patterning layer comprised of an amorphous, conductive substance;

providing a second silicon-containing layer over said patterning layer;

and wherein said patterning layer creates a nano-rugged texture in said second silicon-containing layer.

2. The method of claim 1, wherein said first silicon-containing layer is comprised of polycrystalline silicon.

3. The method of claim 1, wherein said patterning layer is comprised of a material which has small holes such that said step of providing said second silicon-containing layer utilizes said first silicon-containing layer as a seed layer through said small holes so as to form said second silicon-containing layer.

4. The method of claim 1, wherein said patterning layer is comprised of material selected iron the group consisting of: titanium nitride, iridium oxide, and ruthenium oxide.

5. The method of claim 1, wherein said second silicon-containing layer is comprised of a purality of islands of silicon-containing material separated by voids in said silicon-containing material.

6. A method of fabricating an electrical device over a silicon-containing substrate, said method comprising the steps of:

providing a first silicon-containing layer;

providing a patterning layer over said first silicon-containing layer; said patterning layer (comprised of an amorphous, conductive substance;

providing a second silicon-containing layer over said patterning layer;

and wherein said patterning layer creates a nano-rugged texture in said second silicon-containing layer.

7. The method of claim 6, wherein said electrical device is a storage capacitor.

8. The method of claim 7, wherein said storage capacitor is used in a memory device.

* * * * *